(12) United States Patent
Huh et al.

(10) Patent No.: US 7,884,370 B2
(45) Date of Patent: Feb. 8, 2011

(54) ORGANIC LIGHT EMITTING DIODE DISPLAY AND METHOD FOR MANUFACTURING THE SAME

(75) Inventors: Jong-Moo Huh, Hwasung-si (KR); Joon-Hoo Choi, Seoul (KR); Seung-Kyu Park, Hwaseong-si (KR); Byoung-Seong Jeong, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 423 days.

(21) Appl. No.: 11/773,059

(22) Filed: Jul. 3, 2007

(65) Prior Publication Data

US 2008/0042139 A1 Feb. 21, 2008

(30) Foreign Application Priority Data

Aug. 18, 2006 (KR) .................. 10-2006-0077990

(51) Int. Cl.
H01L 27/14 (2006.01)
H01L 21/84 (2006.01)

(52) U.S. Cl. .......... 257/72; 257/E31.043; 257/E51.018; 257/E51.022; 438/158; 438/155; 345/45; 345/46; 345/51

(58) Field of Classification Search .................. 257/72, 257/E31.043, E51.018, E51.022; 438/22, 438/149, 155, 158, 151; 345/39, 45, 46, 345/51, 92
See application file for complete search history.

(56) References Cited

U.S. PATENT DOCUMENTS

2001/0025959 A1* 10/2001 Yamazaki et al. ............. 257/72
2001/0053570 A1* 12/2001 Kido ........................ 438/149
2005/0017244 A1* 1/2005 Hoffman et al. ............. 257/72
2006/0062352 A1* 3/2006 Nomura et al. ............. 378/98.8

FOREIGN PATENT DOCUMENTS

| JP | 2003223120 | 8/2003 |
|---|---|---|
| JP | 2004179138 | 6/2004 |
| KR | 1020020071660 | 9/2002 |

* cited by examiner

Primary Examiner—Thanh V Pham
Assistant Examiner—Maria Ligai
(74) Attorney, Agent, or Firm—Cantor Colburn LLP

(57) ABSTRACT

A method for manufacturing an organic light emitting diode display includes disposing a crystalline semiconductor layer on a substrate, disposing a gate line, a driving input electrode, and a driving output electrode on the crystalline semiconductor layer, the gate line including a switching control electrode, patterning the crystalline semiconductor layer using the gate line, the driving input electrode, and the driving output electrode as a mask, disposing a gate insulating layer and an amorphous semiconductor layer on the gate line, the driving input electrode, and the driving output electrode, disposing a data line, a driving voltage line, a switching output electrode, and a driving control electrode on the amorphous semiconductor, the data line including a switching input electrode, disposing a pixel electrode connected to the driving output electrode, disposing a light emitting member on the pixel electrode, and disposing a common electrode on the light emitting member.

11 Claims, 18 Drawing Sheets

US 7,884,370 B2

ORGANIC LIGHT EMITTING DIODE DISPLAY AND METHOD FOR MANUFACTURING THE SAME

This application claims priority to Korean Patent Application No. 10-2006-0077990, filed on Aug. 18, 2006, and all the benefits accruing therefrom under 35 U.S.C. §119, the contents of which in its entirety are herein incorporated by reference.

BACKGROUND OF THE INVENTION (a) Field of the Invention

The present invention relates to an organic light emitting device ("OLED") and a method for manufacturing the same.

(b) Description of the Related Art

Recent trends towards lightweight and thin personal computers and television sets require lightweight and thin display devices. Flat panel displays satisfying such requirements are being substituted for conventional cathode ray tubes ("CRT").

Flat panel displays include liquid crystal displays ("LCDs"), field emission displays ("FEDs"), organic light emitting devices ("OLEDs"), plasma display panel ("PDPs"), and various other types of displays. However, among the various flat panel displays, the OLED is the most promising because of its low power consumption, fast response time, wide viewing angle, and high contrast ratio.

An OLED is a self-emissive display device which includes at least two electrodes and an organic light emitting layer interposed therebetween. One of the two electrodes injects holes into the light emitting layer and the other of the two electrodes injects electrons into the light emitting layer. The injected electrons and holes are combined to form excitons, and when the excitons de-excite they release energy in the form of visible wavelength photons.

OLEDs may be divided into passive matrix OLEDs and active matrix OLEDs depending on which method is used to drive them.

Passive matrix OLEDs include a plurality of anode lines, a plurality of cathode lines intersecting the anode lines and a plurality of pixels, each including a light emitting layer. The selection by the driving apparatus of one of the anode lines and one of the cathode lines causes light emission in the pixel located at the intersection of the selected signal lines.

Active matrix OLEDs include a plurality of pixels, each including a switching transistor, a driving transistor and a storage capacitor, as well as an anode, a cathode and a light emitting layer. The driving transistor receives a data voltage from the switching transistor and drives a current having a magnitude which is dependent on the data voltage. The current driven by the driving transistor enters the light emitting layer and causes light emission having an intensity depending on the magnitude of the current from the driving transistor.

In order to optimize the performance of the OLED, the characteristics of the switching transistor and the driving transistor are different from each other. That is, the switching transistor requires a high on/off current ratio, namely Ion/Ioff, while the driving transistor requires high charge carrier mobility and high stability for flowing sufficient and steady current to an organic light emitting diode.

When the magnitude of the off current of the switching transistor is large, a data voltage applied to the driving transistor decreases such that cross-talk between nearby pixels may occur. In addition, when the charge carrier mobility and the stability of the driving transistor are low, the current amount flowing to the organic light emitting diode reduces such that the amount of light emitted by the organic light emitting diode decreases, image sticking occurs, and the lifetime of the organic light emitting diode is reduced.

However, when the switching transistor and the driving transistor are separately manufactured through separate processes, respectively, in order to create a display which simultaneously satisfies the characteristics of the switching transistor and the driving transistor, the number of masks used in its manufacture and the costs associated therewith are increased.

BRIEF SUMMARY OF THE INVENTION

An exemplary embodiment of a method for manufacturing an exemplary embodiment of an organic light emitting diode display includes disposing a crystalline semiconductor layer on a substrate, disposing a gate line, a driving input electrode, and a driving output electrode on the crystalline semiconductor layer, the gate line including a switching control electrode, patterning the crystalline semiconductor layer using the gate line, the driving input electrode, and the driving output electrode as a mask, disposing a gate insulating layer and an amorphous semiconductor layer on the gate line, the driving input electrode, and the driving output electrode, disposing a data line, a driving voltage line, a switching output electrode, and a driving control electrode on the amorphous semiconductor, the data line including a switching input electrode, disposing a pixel electrode connected to the driving output electrode, disposing a light emitting member on the pixel electrode, and disposing a common electrode on the light emitting member.

In one exemplary embodiment, the formation of the crystalline semiconductor layer may include depositing an amorphous semiconductor layer on the substrate and crystallizing the amorphous semiconductor layer.

In one exemplary embodiment, the amorphous semiconductor layer may be crystallized by a solid phase crystallization ("SPC") process.

In one exemplary embodiment, the method may further include forming an impurity doped amorphous semiconductor layer after the formation of the amorphous semiconductor layer, and the crystallization of the amorphous semiconductor layer may include crystallizing the amorphous semiconductor layer and the impurity doped amorphous semiconductor layer thereby forming the crystalline semiconductor layer and an impurity doped crystalline semiconductor layer.

In one exemplary embodiment, the method may further include etching the impurity doped crystalline semiconductor layer using the driving input electrode and the driving output electrode as a mask after the patterning of the crystalline semiconductor layer.

In one exemplary embodiment, the formation of the gate line, the driving input electrode, and the driving output electrode may include forming a conductive layer and etching the conductive layer using a photoresist including a first portion and a second portion which is thinner than the first portion.

In one exemplary embodiment, the method may include forming a color filter before the formation of the pixel electrode.

In one exemplary embodiment, the method may include forming a color filter on the light emitting member.

An exemplary embodiment of an organic light emitting diode display includes a substrate, a gate line disposed on the substrate, a data line disposed on the substrate substantially perpendicular to the gate line, a driving voltage line disposed substantially parallel to one of the gate line and the data line, a switching thin film transistor connected to the gate line and the data line, the switching thin film transistor including amorphous silicon, a driving thin film transistor connected to the switching thin film transistor and the driving voltage line, the driving thin film transistor including a first crystalline semiconductor, a light emitting diode connected to the driving thin film transistor, and a second crystalline semiconductor underlying the gate line, the second crystalline semiconductor having substantially the same planar shape as the gate line.

In one exemplary embodiment, the switching thin film transistor may further include a switching control electrode connected to the gate line, a switching input electrode formed on the amorphous semiconductor and connected to the data line, and a switching output electrode disposed on the amorphous semiconductor and disposed substantially opposite the switching input electrode with respect to the switching control electrode.

In one exemplary embodiment, the driving thin film transistor may further include a driving input electrode disposed on the first crystalline semiconductor and connected to the driving voltage line, a driving output electrode disposed on the first crystalline semiconductor, and a driving control electrode formed on the driving input electrode and the driving output electrode and connected to the switching output electrode, wherein the driving output electrode is disposed substantially opposite the driving input electrode with respect to the driving control electrode.

In one exemplary embodiment, the switching thin film transistor and the driving thin film transistor may further include a gate insulating layer, and the gate insulating layer is disposed between the switching control electrode and the amorphous semiconductor and between the first crystalline semiconductor and the driving control electrode.

In one exemplary embodiment, the gate line, the switching control electrode, the driving input electrode and the driving output electrode may be disposed on the same layer.

In one exemplary embodiment, the driving input electrode and the driving output electrode may be substantially island shaped.

In one exemplary embodiment, the data line, the driving voltage line, the switching input electrode, the switching output electrode, and the driving control electrode may be disposed on substantially the same layer.

In one exemplary embodiment, a first portion of the first crystalline semiconductor may have substantially the same planar shape as the driving input electrode and a second portion of the first crystalline semiconductor has substantially the same planar shape as the driving output electrode.

In one exemplary embodiment, the organic light emitting diode display may further include a connecting member which connects the driving voltage line and the driving input electrode, and which overlaps the driving control electrode.

In one exemplary embodiment, the light emitting diode may include a pixel electrode connected to the driving thin film transistor, a light emitting member disposed on the pixel electrode, and a common electrode disposed substantially opposite the pixel electrode with respect to the light emitting member.

In one exemplary embodiment, the organic light emitting diode display may further include a color filter disposed between the substrate and the pixel electrode.

In one exemplary embodiment, the organic light emitting diode display may further include a color filter disposed on the light emitting member.

In one exemplary embodiment, the light emitting member may include a plurality of emission layers, which emit different wavelengths of light, and the different wavelengths of light are synthesized into white light.

BRIEF DESCRIPTION OF THE DRAWINGS

The present invention will become more apparent by describing exemplary embodiments thereof in more detail with reference to the accompanying drawings, in which.

DETAILED DESCRIPTION OF THE INVENTION

Figure 1:
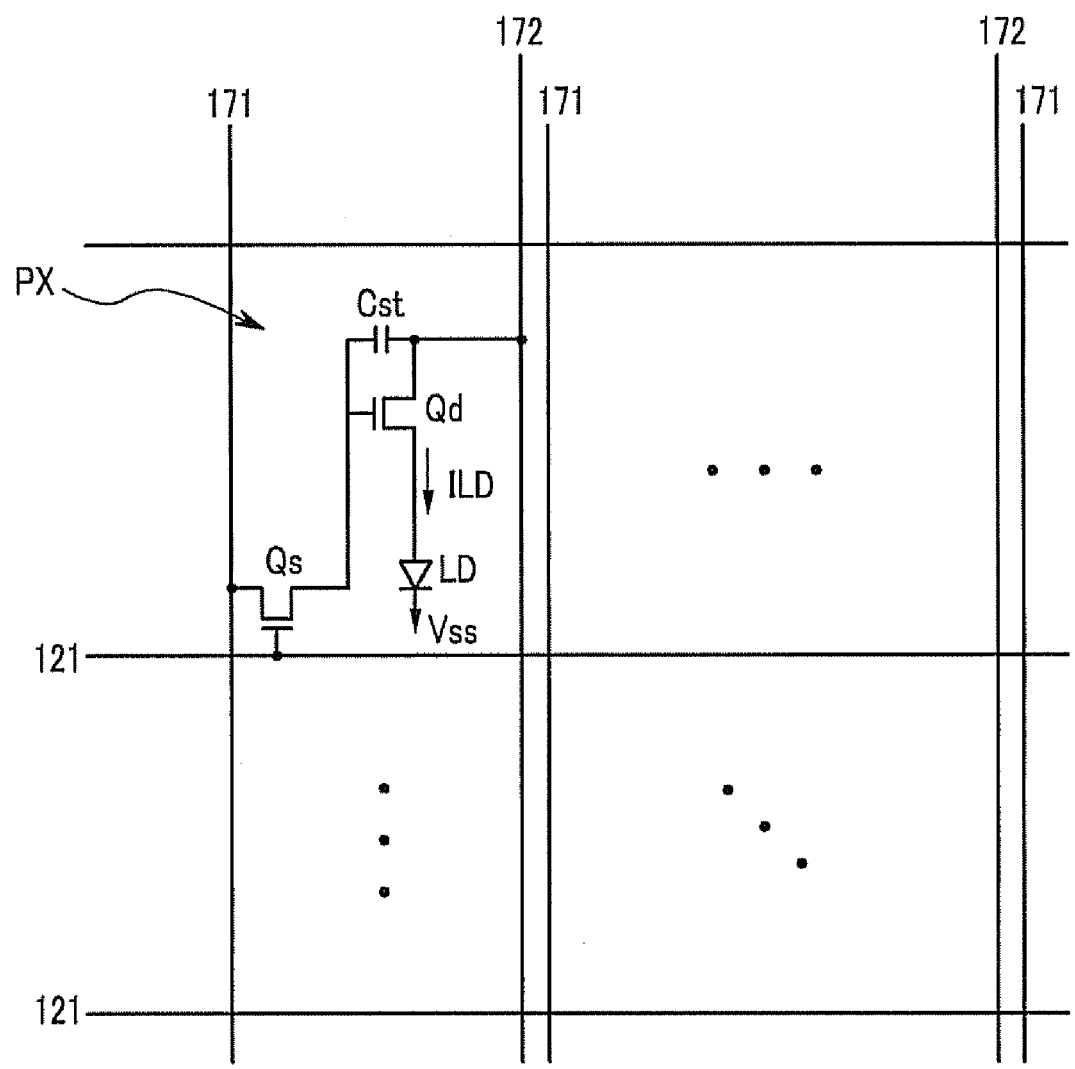
FIG. 1 is an equivalent circuit diagram of an exemplary embodiment of an organic light emitting device ("OLED") according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in more detail with reference to the accompanying drawings.

An exemplary embodiment of an organic light emitting device ("OLED") according to the present invention will be described with reference to FIG. 1.

FIG. 1 is an equivalent circuit diagram of an exemplary embodiment of an OLED according to the present invention.

Referring to FIG. 1, an exemplary embodiment of an OLED according to the present invention includes a plurality of signal lines 121, 171 and 172 and a plurality of pixels PX connected thereto and arranged substantially in a matrix shape.

The signal lines include a plurality of gate lines 121 for transmitting gate signals (also known as scanning signals), a plurality of data lines 171 for transmitting data signals, and a plurality of driving voltage lines 172 for transmitting a driving voltage. The gate lines 121 extend substantially in a row direction and substantially parallel to each other, while the data lines 171 and the driving voltage lines 172 extend substantially in a column direction and substantially parallel to each other and substantially perpendicularly to the gate lines 121.

Each pixel PX includes a switching transistor Qs, a driving transistor Qd, a capacitor Cst and an organic light emitting diode LD.

The switching transistor Qs, exemplary embodiments of which may include a thin film transistor ("TFT"), has a control terminal connected to one of the gate lines 121, an input terminal connected to one of the data lines 171, and an output terminal connected to the driving transistor Qd. The switching transistor Qs transmits the data signals applied to the data line 171 to the driving transistor Qd in response to the gate signal applied to the gate line 121.

The driving transistor Qd, exemplary embodiments of which may include a TFT, has a control terminal connected to the switching transistor Qs, an input terminal connected to the driving signal line 172, and an output terminal connected to the organic light emitting diode LD. The driving transistor Qd drives an output current $I_{LD}$ having a magnitude depending on the voltage differential between the control terminal and the output terminal thereof.

The capacitor Cst is connected between the control terminal and the output terminal of the driving transistor Qd. The capacitor Cst stores the data signal applied to the control terminal of the driving transistor Qd and maintains the data signal after the switching transistor Qd turns off.

The organic light emitting diode LD has an anode connected to the output terminal of the driving transistor Qd and a cathode connected to a common voltage Vss. The organic light emitting diode LD emits light with an intensity depending on an output current $I_{LD}$ of the driving transistor Qd. The exemplary embodiment of an OLED may then use the plurality of organic light emitting diodes LDs in the plurality of pixels to display images. In order to display moving images, the exemplary embodiment of an OLED displays a series of slightly changing images in rapid succession, thereby creating in the viewer the illusion of movement. Each image in the series of images is referred to as a frame.

In the present exemplary embodiment the switching transistor Qs and the driving transistor Qd are n-channel field effect transistors ("FETs"). However, alternative exemplary embodiments include configurations wherein at least one of the switching transistor Qs and the driving transistor Qd may be a p-channel FET. In addition, alternative exemplary embodiments include configurations wherein the connections among the transistors Qs and Qd, the capacitor Cst, and the organic light emitting diode LD may be modified from the abovedescribed exemplary embodiment.

Figure 2:
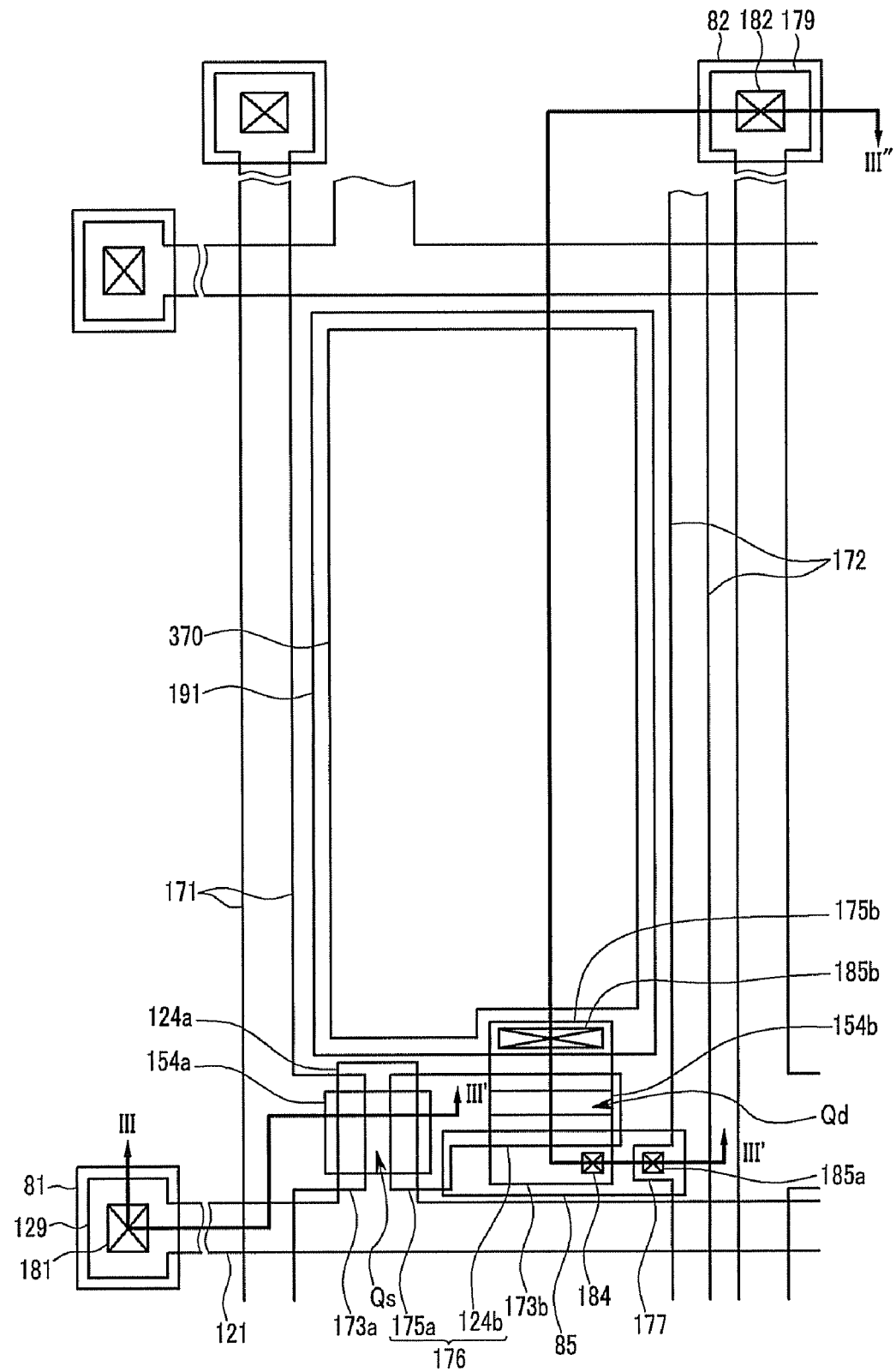
FIG. 2 is a top plan view layout of an exemplary embodiment of an OLED according to the present invention.
Figure 3:
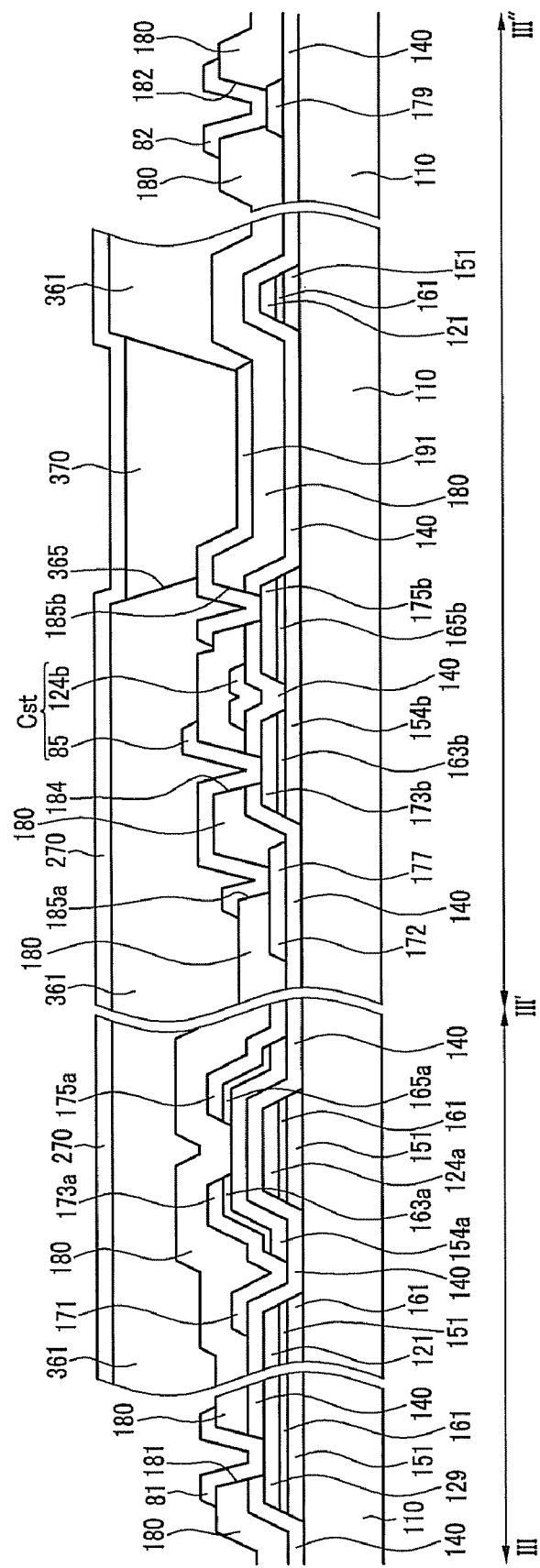
FIG. 3 is a cross-sectional view of the exemplary embodiment of an OLED shown in FIG. 2 taken along line III-III'-III"

Referring to FIGS. 2 and 3, a more detailed structure of the exemplary embodiment of an OLED shown in FIG. 1 according to the present invention will be described in more detail.

FIG. 2 is a top plan view layout of an exemplary embodiment of an OLED according to the present invention, and FIG. 3 is a cross-sectional view of the exemplary embodiment of an OLED shown in FIG. 2 taken along line III-III'-III".

A plurality of driving semiconductor islands 154b and a plurality of semiconductor stripe members 151 are formed on an insulating substrate 110, exemplary embodiments of which may be made of a material such as transparent glass or plastic.

The semiconductor stripe members 151 extend substantially in a transverse direction. The driving semiconductor islands 154b and the semiconductor stripe members 151 may include a crystalline semiconductor material, exemplary embodiments of which include microcrystalline silicon or polycrystalline silicon.

A plurality of gate lines 121, a plurality of driving input electrodes 173b, and a plurality of driving output electrodes 175b are formed on the driving semiconductor islands 154b and the semiconductor stripe members 151.

The gate lines 121 for transmitting gate signals extend substantially in a transverse direction. In the present exemplary embodiment, each of the gate lines 121 further includes an end portion 129 having a large area for contact with another layer or an external driving circuit, and a switching control electrode 124a projecting upward from the gate line 121. In an alternative exemplary embodiment, the gate lines 121 may extend to be directly connected to a gate driving circuit (not shown) for generating the gate signals, and may be integrated with the substrate 110.

Exemplary embodiments include configurations wherein the gate lines 121 have substantially the same planar shape as the semiconductor stripe members 151.

The input electrodes 173b and the driving output electrodes 175b have island shapes and are separated from the gate lines 121. The driving input electrode 173b and a driving output electrode 175b are disposed opposite each other with respect to a driving semiconductor island 154b.

Exemplary embodiments of the gate lines 121, the driving input electrodes 173b, and the driving output electrodes 175b may be made of an Al-containing metal such as Al or an Al alloy, a Ag-containing metal such as Ag or a Ag alloy, a Cu-containing metal such as Cu or a Cu alloy, a Mo-containing metal such as Mo or a Mo alloy, Cr, Ta, Ti, or other similar materials. In an alternative exemplary embodiment, the gate lines 121, the driving input electrodes 173b, and the driving output electrodes 175b may have a multilayered structure including two films having different physical characteristics.

Exemplary embodiments include configurations wherein the lateral sides of the gate lines 121, the driving input electrodes 173b, and the driving output electrodes 175b are inclined relative to a surface of the substrate 110, and the inclination angle thereof is in a range from about 30 degrees to about 80 degrees.

A plurality of pairs of ohmic contact islands 163b and 165b are formed on the driving semiconductor islands 154b underneath the driving input electrodes 173b and the driving output electrodes 175b, respectively. Furthermore, impurity doped semiconductor stripe members 161, in which impurities are doped, are formed between the gate lines 121 and the semiconductor stripe members 151.

Exemplary embodiments include configurations wherein the ohmic contacts 163b and 165b and the impurity doped semiconductor stripe members 161 are made of a crystalline semiconductor material such as microcrystalline silicon or n+ hydrogenated a-Si heavily doped with an n-type impurity such as phosphorous.

A gate insulating layer 140, exemplary embodiments of which may be made of silicon oxide ("SiOx") or silicon nitride ("SiNx"), is formed on the gate lines 121, the driving input electrodes 173b and the driving output electrodes 175b. Exemplary embodiments of the gate insulating layer 140 may have a single-layered structure, or may have a multi-layered structure including a first layer of silicon oxide and a second layer of silicon nitride.

A plurality of switching semiconductor islands 154a, exemplary embodiments of which may be made of hydrogenated a-Si, are formed on the gate insulating layer 140. The switching semiconductor islands 154a overlap the switching control electrodes 124a.

A plurality of data lines 171, a plurality of driving voltage lines 172 and a plurality of electrode members 176 are formed on the switching semiconductor islands 154a.

The data lines 171 for transmitting data signals extend substantially in the longitudinal direction and intersect, but are not directly connected to, the gate lines 121. Each of the data lines 171 includes a plurality of switching input electrodes 173a extending toward the switching control electrodes 124a. In the present exemplary embodiment, the data lines 171 include an end portion 179 having a large area for contact with another layer or an external driving circuit. In an alternative exemplary embodiment, the data lines 171 may extend to be directly connected to a data driving circuit (not shown) for generating the data signals, which may be integrated with the substrate 110.

The driving voltage lines 172 for transmitting driving voltages extend substantially in the longitudinal direction and intersect the gate lines 121. Each of the driving voltage lines 172 includes a plurality of protrusions 177.

The electrode members 176 have island shapes and are separated from the data lines 171 and the driving voltage lines 172.

Each of the electrode members 176 includes a portion 175a facing the switching input electrode 173a. The portion 175a will be referred to as a "switching output electrode" hereinafter. The electrode members 176 also include a portion 124b overlapping the driving semiconductor island 154b. The portion 124b will be referred to as a "driving control electrode" hereinafter. Each of a pair of a switching input electrode 173a and a switching output electrode 175a are disposed opposite each other with respect to a switching semiconductor island 154a.

Exemplary embodiments include configurations wherein the data lines 171, the driving voltage lines 172 and the electrode members 176 may be made of the same material as the gate lines 121.

Exemplary embodiments include configurations wherein the data lines 171, the driving voltage lines 172 and the electrode members 176 have inclined edge profiles, and the inclination angles thereof are in a range from about 30 to about 80 degrees.

A plurality of pairs of ohmic contact islands 163a and 165a are formed between the switching semiconductor islands 154a and the switching input electrodes 173a and the switching semiconductor islands 154a and the switching output electrodes 175a, respectively. Exemplary embodiments include configurations wherein the ohmic contact islands 163a and 165a are made of n+ hydrogenated a-Si heavily doped with an n-type impurity such as phosphorous.

A passivation layer 180 is formed on the data lines 171, the driving voltage lines 172 and the electrode members 176.

The passivation layer 180 has a plurality of contact holes 185a and 182 exposing the protrusions 177 of the driving voltage lines 172 and the end portions 179 of the data lines 171, respectively, and the passivation layer 180 and the gate insulating layer 140 have a plurality of contact holes 181, 184 and 185b exposing the end portions 129 of the gate lines 121, the driving input electrodes 173b and the driving output electrodes 175b, respectively.

A plurality of pixel electrodes 191, a plurality of connecting members 85, and a plurality of contact assistants 81 and 82 are formed on the passivation layer 180.

The pixel electrodes 191 are connected to the driving output electrodes 175b through the contact holes 185b.

The connecting members 85 are connected to the protrusions 177 of the driving voltage lines 172 and the driving input electrodes 173b through the contact holes 185a and 184, respectively, and portions of the connecting members 85 overlap the driving control electrodes 124b to form storage capacitors Cst.

The contact assistants 81 and 82 are connected to the end portions 129 and 179 of the gate lines 121 and the data lines 171 through the contact holes 181 and 182, respectively. The contact assistants 81 and 82 protect the end portions 129 and 179 and enhance the adhesion between the end portions 129 and 179 and external devices.

The pixel electrodes 191, the connecting members 85, and the contact assistants 81 and 82 may be made of a transparent conductor, exemplary embodiments of which include indium tin oxide ("ITO") or indium zinc oxide ("IZO").

The use of a transparent conductor for the pixel electrodes 191, the connecting members 85 and the contact assistants 81 and 82 is especially useful when light emitted from the organic light emitting diode LD passes through the pixel electrode 191 to an outside. Such a configuration is called a bottom-emission type display. Alternatively, a top-emission type display includes a configuration wherein the light from the organic light emitting diode LD travels in the substantially opposite direction from the pixel electrode 191.

In an alternative exemplary embodiment, when the exemplary embodiment of an OLED according to the present invention is a top-emission type display, the pixel electrodes 191, the connecting members 85, and the contact assistants 81 and may be made of an opaque conductor, exemplary embodiments of which include Al or an Al alloy, Au, Pt, Ni, Cu, or W all of which have a high work function, or alloys thereof.

A partition 361 is formed on the pixel electrodes 191, the connecting members 85, and the contact assistants 81 and 82. The partition 361 surrounds the pixel electrodes 191 like a bank to define openings 365. Exemplary embodiments include configurations wherein the partition 361 may be made of an organic material having thermal resistance and solvent resistance such as an acrylic resin, polyimide resin, or other similar materials, or an inorganic insulating material such as silicon dioxide ("SiO$_2$"), titanium dioxide ("TiO$_2$"), or other similar materials, and exemplary embodiments include configurations wherein it may have a double-layered structure. The partition 361 may be made of a photosensitive material containing a black pigment so that the black partition 361 may serve as a light blocking member and the formation of the partition 361 may be simplified.

A plurality of organic light emitting members 370 are formed on the pixel electrodes 191 and confined in the openings 365 defined by the partition 361.

Exemplary embodiments include configurations wherein each of the organic light emitting members 370 have a multi-layered structure including an emitting layer (not shown) for emitting light and auxiliary layers (not shown) for improving the efficiency of light emission of the emitting layer.

Exemplary embodiments of the light emitting layers are made of a high molecular weight compound, a low molecular weight compound, or mixtures thereof uniquely emitting one of primary color lights such as red, green and blue. Exemplary embodiments of the high molecular weight compounds include a polyfluorene derivative, a (poly)paraphenylenevinylene derivative, a polyphenylene derivative, polyvinylcarbazole, a polythiophene derivative, or other similar materials. Exemplary embodiments of the low molecular weight compounds include anthracene such as 9,10-diphenylanthracene, butadiene such as tetraphenylbutadiene, tetracene, a distyrylarylene derivative, a benzazole derivative, a carbazole derivative, or other similar materials. In an alternative exemplary embodiment, the high or low molecular weight compound is used as a host. The host is doped by a dopant exemplary embodiments of which include xanthene, perylene, cumarine, rhodamine, rubrene, a dicyanomethylenepyran compound, a thiopyran compound, a (thia)pyrilium compound, a periflanthene derivative, an indenoperylene derivative, a carbostyryl compound, Nile red, and quinacridone to enhance the efficiency of light emission. In one exemplary embodiment, the OLED displays images by spatially adding the monochromatic primary color light emitted from the light emitting layers of nearby pixels; alternative exemplary embodiments include configurations wherein each pixel emits a white light which is then colorized by a color filter layer (not shown).

The auxiliary layers may include an electron transport layer (not shown) and a hole transport layer (not shown) for improving the balance of the electrons and holes in the emitting layer and an electron injecting layer (not shown) and a hole injecting layer (not shown) for improving the injection of the electrons and holes, and the auxiliary layers may include one or more of the abovementioned layers. Exemplary embodiments of the hole transport layer and the hole injecting layer may be made of a material having a work function of a magnitude which is intermediate between that of the pixel electrode 191 and the light emitting layer, and exemplary embodiments of the electron transport layer and the electron injecting layer may be made of a material having a work function which is intermediate between that of a common electrode 270 and the light emitting layers.

Exemplary embodiments of the hole transport layer and the hole injecting layer may include a diamine compound, [4,4', 4"-tris (3-methylphenyl) phenylamino]triphenylamine ("MTDATA"), N,N'-diphenyl-N,N'-di(3-methylphenyl)-1, 1'-biphenyl-4,4'-diamine ("TPD"), 1,1-bis(4-di-p-tolylaminophenyl) cyclohexane, N,N,N',N'-tetra(2-naphthyl)-4,4-diamino-p-terphenyl, 4,4',4-tris[(3-methylphenyl) phenylamino]triphenylamine, polypyrrole, polyaniline, or a mixture of poly-3,4-ethylenedioxythiophene and polystyrenesulfonate ("PEDOT:PSS").

In the organic light emitting members 370, by arranging the light emitting layers emitting one of the primary colors such as red, green and blue corresponding to each pixel, a desired color may be represented using a combination of the three primary colored pixels. Furthermore, as discussed above, light emitting layers for red, green and blue may be perpendicularly or horizontally formed in each pixel, to form white light emitting layers. Alternatively, white light may be emitted by synthesizing light having different wavelengths. When white light is emitted, color filters (not shown) may be formed under or on the light emitting layers for displaying red, green and blue. The color filters may be formed under the light emitting layers in a bottom-emission type display, while the color filters may be formed on the light emitting layers in a top-emission type display.

In an alternative exemplary embodiment four pixels, one each for red, green, blue, and white may be disposed in a stripe shape or a mosaic shape to improve luminance of the display.

A common electrode 270 is formed on the light emitting members 370 and the partition 361. The common electrode 270 is formed on substantially the entire surface of the organic light emitting members 370, and applies a current to the organic light emitting member 370 along with the pixels electrodes 191.

The pixel electrode 191, the organic light emitting member 370 and the common electrode 270 form the organic light emitting diode LD having the pixel electrode 191 as an anode and the common electrode 270 as a cathode, or vice versa.

In the above-described exemplary embodiment of an OLED, the switching control electrode 124a connected to the gate line 121, the switching input electrode 173a connected to the data line 171, and the switching output electrode 175a along with the switching semiconductor island 154a form the switching TFT Qs having a channel formed in the switching semiconductor island 154a disposed between the switching input electrode 173a and the switching output electrode 175a. Similarly, the driving control electrode 124b connected to the switching output electrode 175a, the driving input electrode 173b connected to a driving voltage line 172, and the driving output electrode 175b connected to the pixel electrode 191 along with the driving semiconductor island 154b form the driving TFT Qd having a channel formed in the driving semiconductor island 154b disposed between the driving input electrode 173b and the driving output electrode 175b.

As described above, exemplary embodiments of the switching semiconductor islands 154a are made of an amorphous semiconductor material, and exemplary embodiments of the driving semiconductor islands 154b are made of a crystalline semiconductor material. That is, a channel of a switching TFT Qs is formed in the amorphous semiconductor, and a channel of a driving TFT Qd is formed in the crystalline semiconductor.

Thereby, in this exemplary embodiment, the channels of the switching TFTs Qs and the driving TFTs Qd include semiconductors having a different crystalline state from each other, and thereby the different characteristics required for the respective switching and driving TFTs Qs and Qd are simultaneously satisfied. When the channels of the driving TFTs Qd are formed in the microcrystalline or polycrystalline semiconductor, the driving TFTs Qd may have high charge carrier mobility and stability, and thereby the amount of current flowing into an organic light emitting diode may be increased and held at a constant rate which improves the luminance of the organic light emitting diode. In addition, a variation of the threshold voltage of the driving TFT due to application of a continued positive voltage thereto is reduced or effectively prevented. Therefore the degradation and shortening of the lifetime of the driving TFTs are prevented, and image deterioration such as image sticking is reduced or effectively prevented.

Meanwhile, in a switching TFT as opposed to a driving TFT, the current on/off characteristics (Ion/Ioff) of the transistor are important, and specifically a low off current of the switching TFT is especially advantageous for improving display quality. However, when the switching TFT Qs is formed by a microcrystalline or polycrystalline semiconductor, the off current increases because of grain boundaries within the semiconductor layer such that a data voltage drop within the switching TFT occurs and may cause cross talk between adjacent pixels. In the exemplary embodiment of the present invention, the switching TFT is formed of an amorphous semiconductor such as a-Si, of which occurrence of the off current is relatively low with respect to the microcrystalline or polycrystalline semiconductor, resulting in the prevention of a data voltage drop and a reduction or effective prevention of cross talk.

The previously described exemplary embodiment of the present invention included a configuration wherein each of the pixels includes one switching TFT Qs and one driving TFT Qd, however alternative exemplary embodiments include configurations including at least one transistor and a plurality of wires for driving the transistor such that deterioration of the organic light emitting diode LD and the driving TFT Qs due to a long driving time is prevented or compensated for, to prevent a reduction of the lifetime of the organic light emitting diode.

Now, an exemplary embodiment of a method of manufacturing the exemplary embodiment of an OLED shown in FIGS. 2 and 3 according to the present invention is described with reference to FIGS. 4 to 18, as well as FIGS. 2 and 3.

Figure 9:
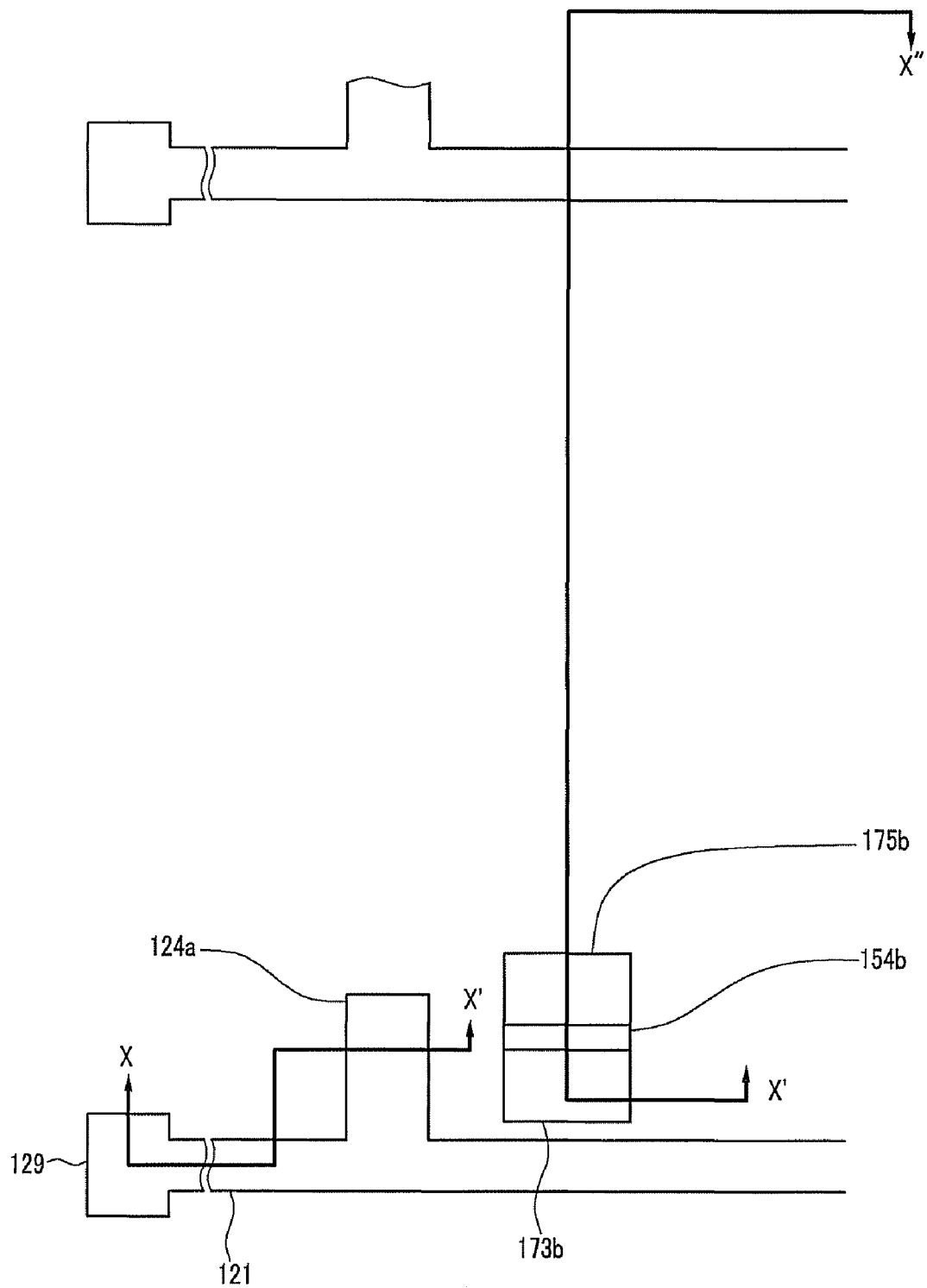
FIGS. 9, 11, 13, 15, and 17 are top plan view layouts of the exemplary embodiment of an OLED shown in FIGS. 2 and 3 in intermediate steps of an exemplary embodiment of a method of manufacturing the same according to the present invention.
Figure 10:
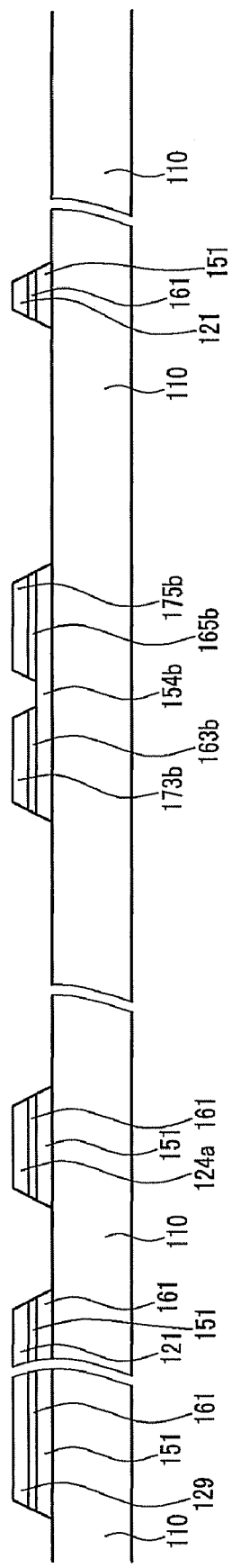
FIG. 10 is a cross-sectional view of the exemplary embodiment of an OLED shown in FIG. 9 taken along lines X-X'-X"
Figure 11:
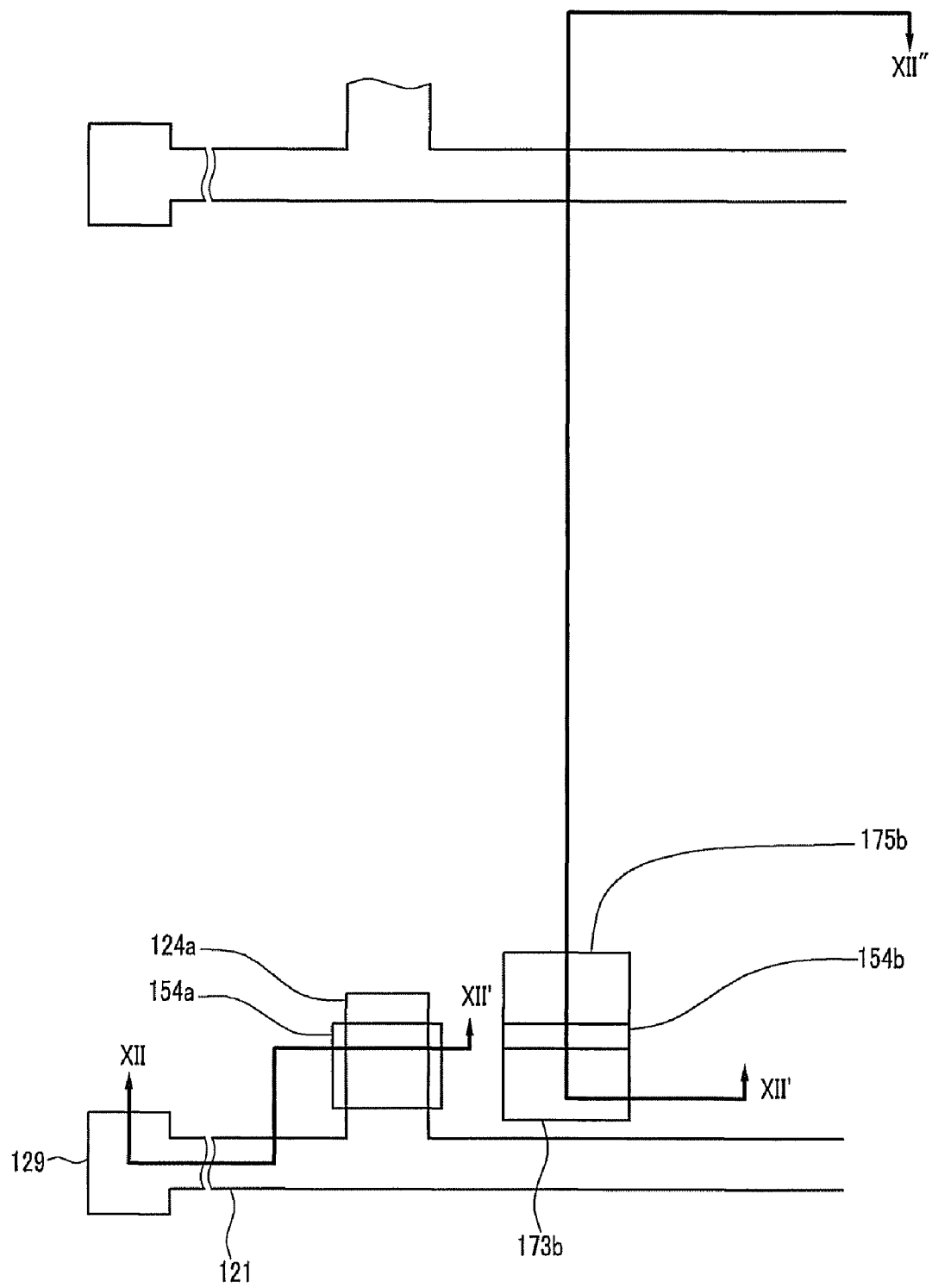
Figure 12:
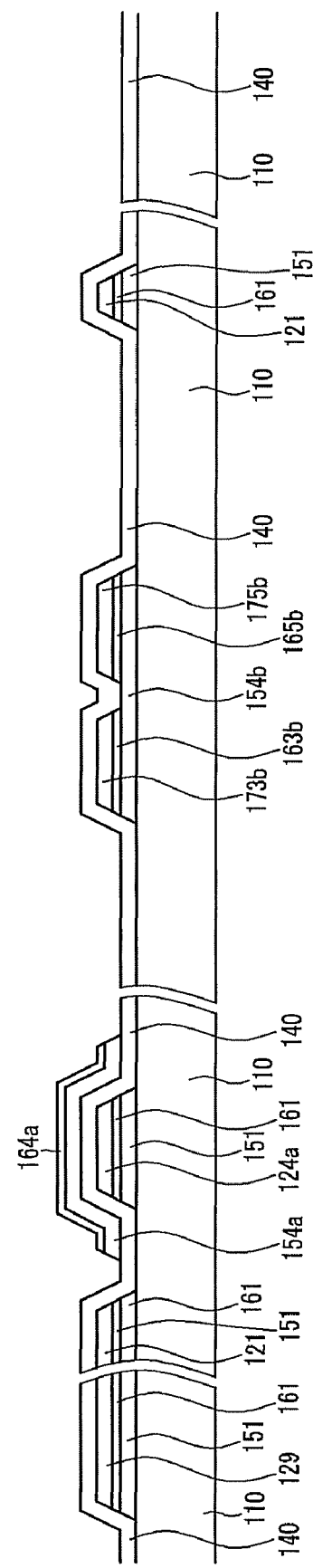
FIG. 12 is a cross-sectional view of the exemplary embodiment of an OLED shown in FIG. 11 taken along lines XII-XII'-XII"
Figure 13:
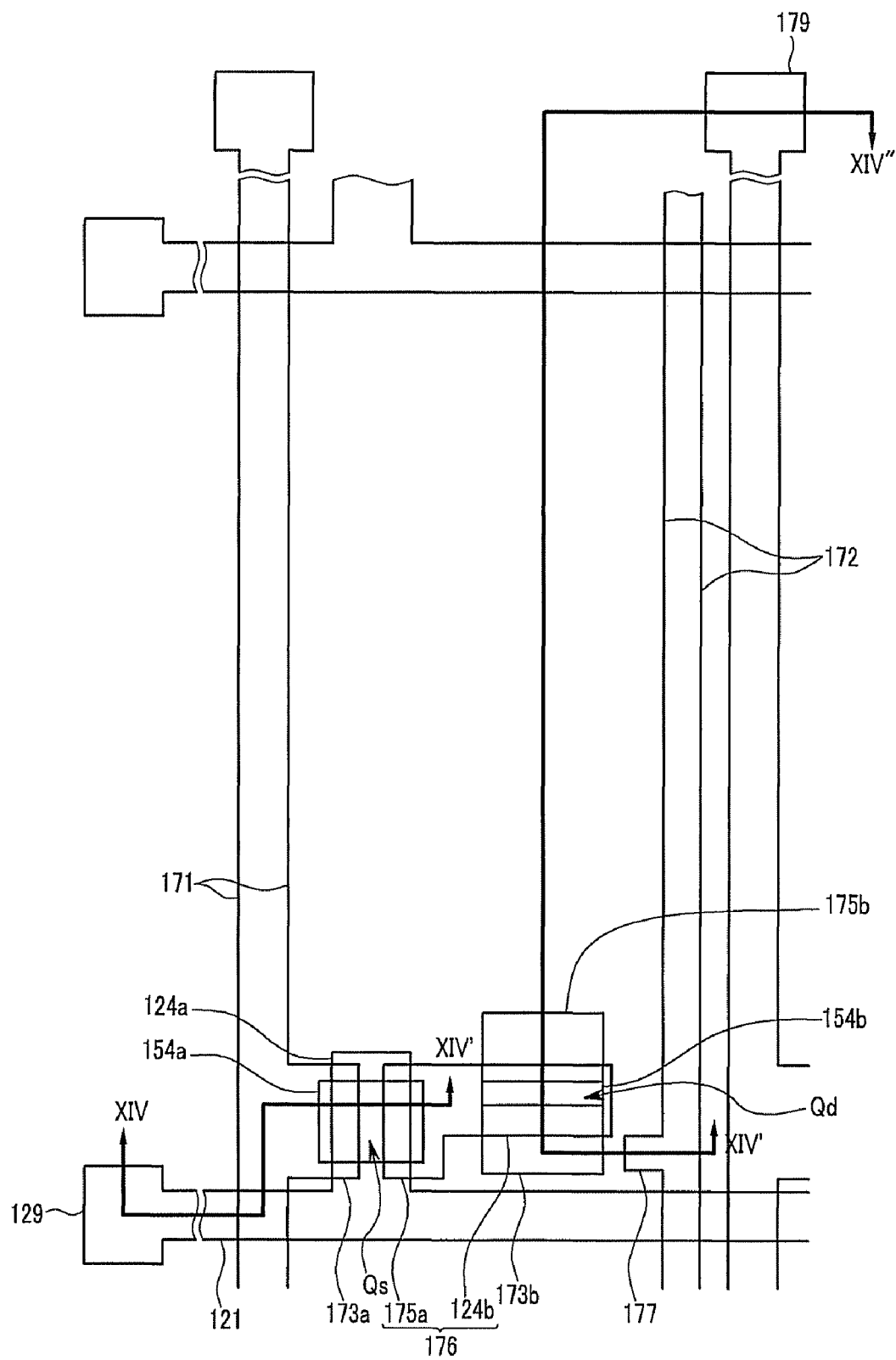
Figure 14:
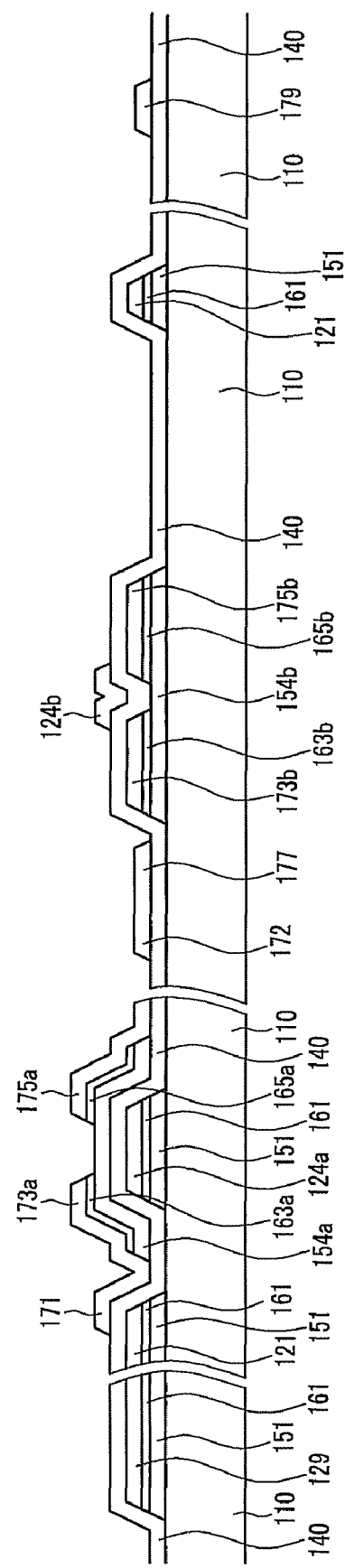
FIG. 14 is a cross-sectional view of the exemplary embodiment of an OLED shown in FIG. 13 taken along lines XIV-XIV'-XIV"
Figure 15:
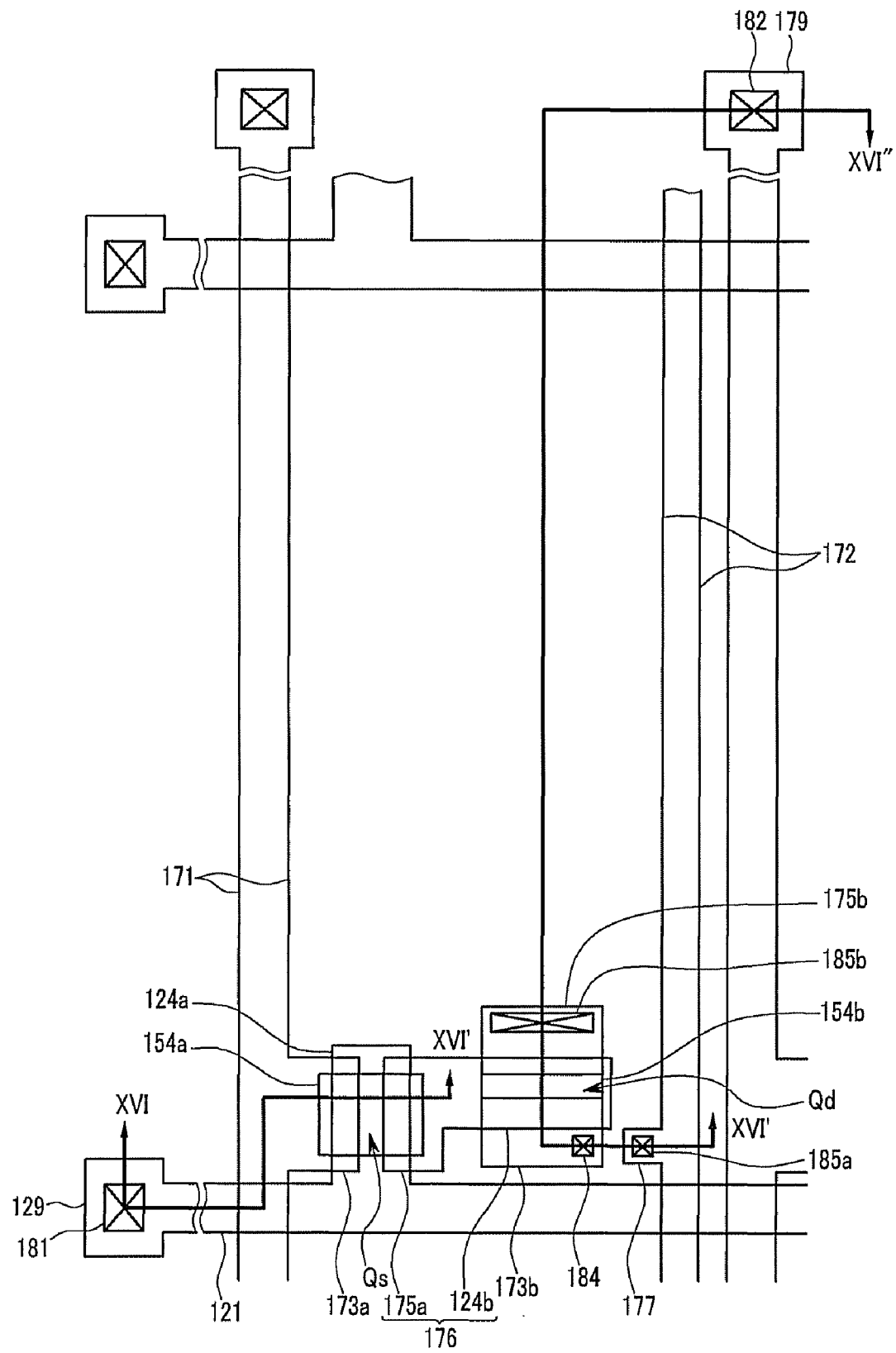
Figure 16:
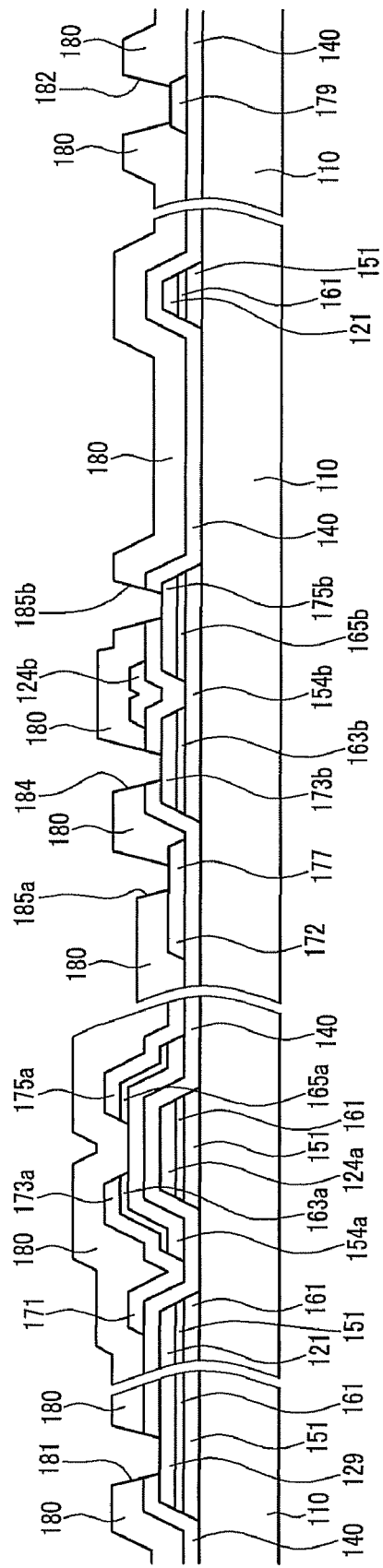
FIG. 16 is a cross-sectional view of the exemplary embodiment of an OLED shown in FIG. 15 taken along lines XVI-XVI'-XVI"
Figure 17:
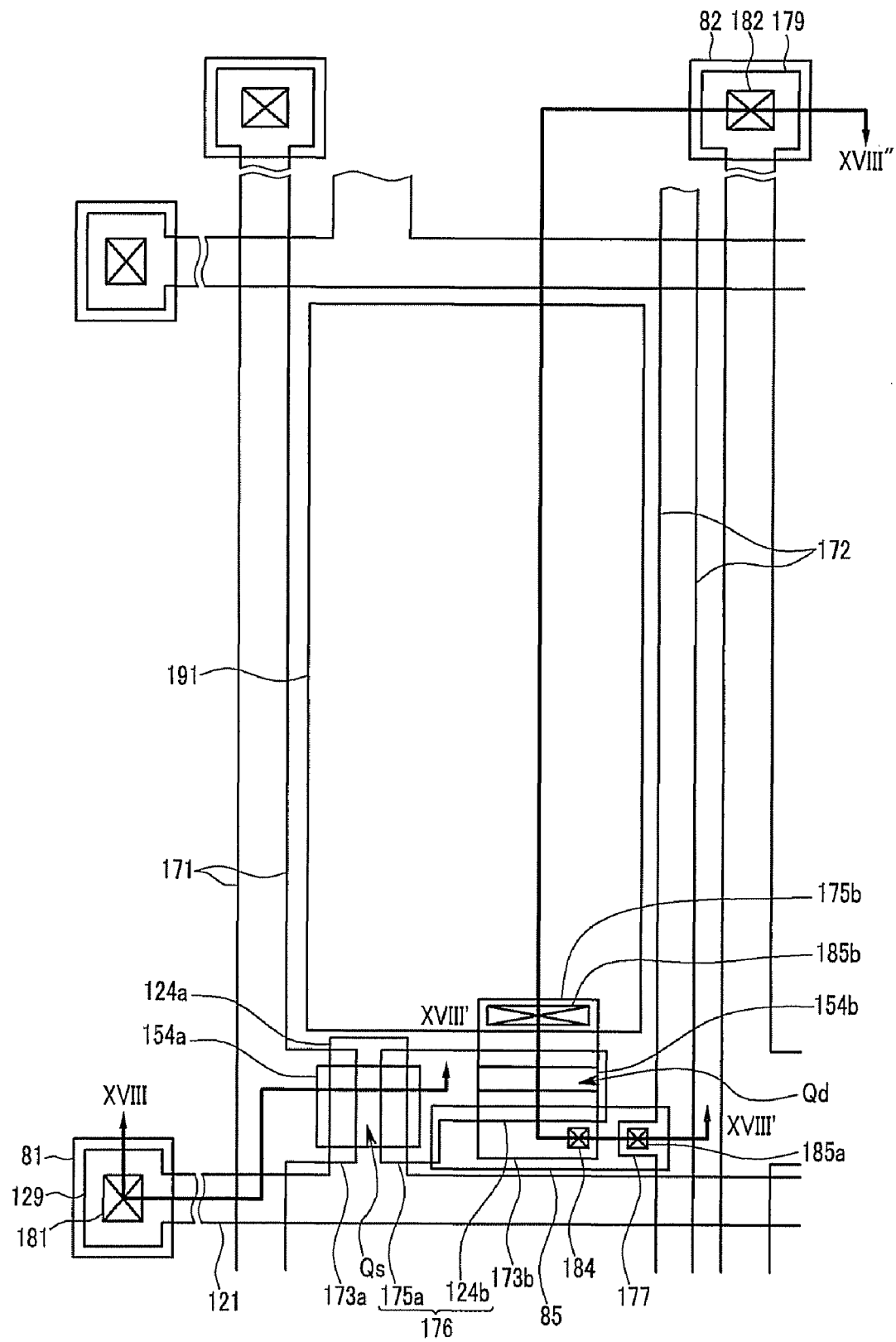
Figure 18:
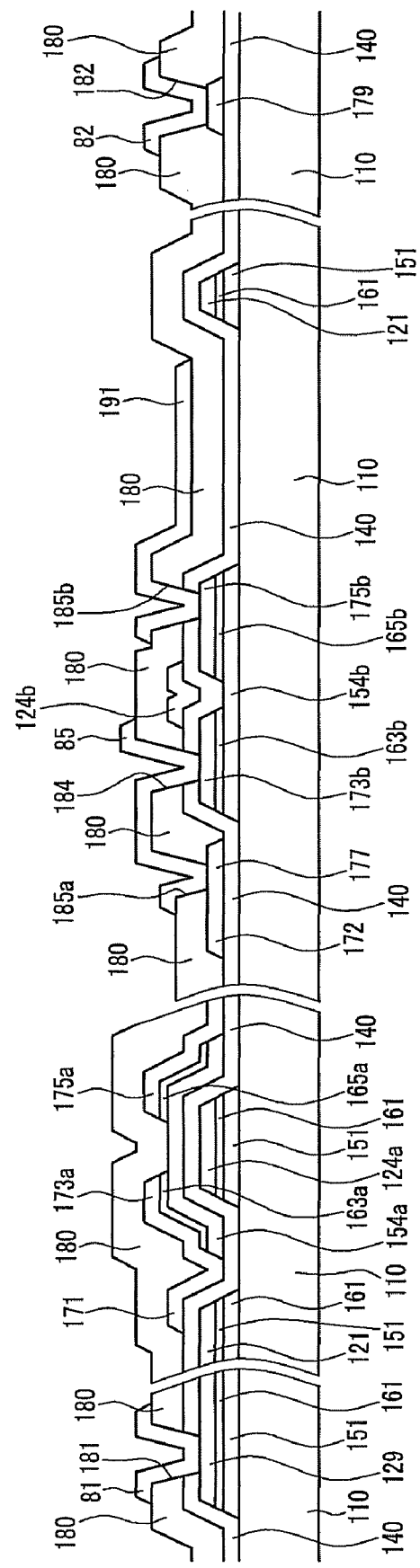
FIG. 18 is a cross-sectional view of the exemplary embodiment of an OLED shown in FIG. 17 taken along lines XVIII-XVIII'-XVIII".

FIGS. 4 to 8 are cross-sectional views of the exemplary embodiment of an OLED shown in FIGS. 2 and 3 sequentially showing an exemplary embodiment of a method of manufacturing an exemplary embodiment of an OLED according to the present invention;

FIGS. 9, 11, 13, 15 and 17 are top plan view layouts of the exemplary embodiment of an OLED shown in FIGS. 2 and 3 in intermediate steps of an exemplary embodiment of a method of manufacturing the same according to the present invention, FIG. 10 is a cross-sectional view of the exemplary embodiment of an OLED shown in FIG. 9 taken along lines X-X'-X", FIG. 12 is a cross-sectional view of the exemplary embodiment of an OLED shown in FIG. 11 taken along lines XII-XII'-XII", FIG. 14 is a cross-sectional view of the exemplary embodiment of an OLED shown in FIG. 13 taken along lines XIV-XIV'-XIV", FIG. 16 is a cross-sectional view of the exemplary embodiment of an OLED shown in FIG. 15 taken along lines XVI-XVI'-XVI", and FIG. 18 is a cross-sectional view of the exemplary embodiment of an OLED shown in FIG. 17 taken along lines XVIII-XVIII'-XVIII".

Figure 4:
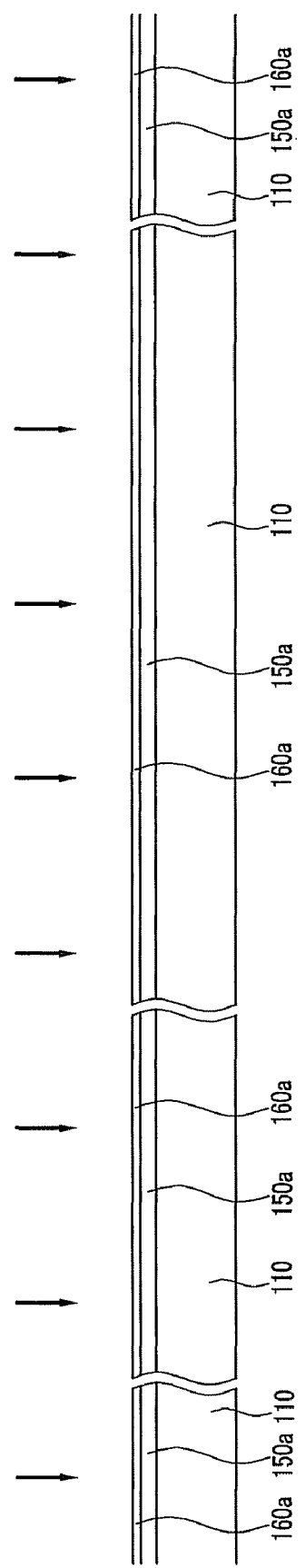
FIGS. 4 to 8 are cross-sectional views of the exemplary embodiment of an OLED shown in FIGS. 2 and 3 sequentially showing an exemplary embodiment of a method of manufacturing an exemplary embodiment of an OLED according to the present invention.
Figure 5:
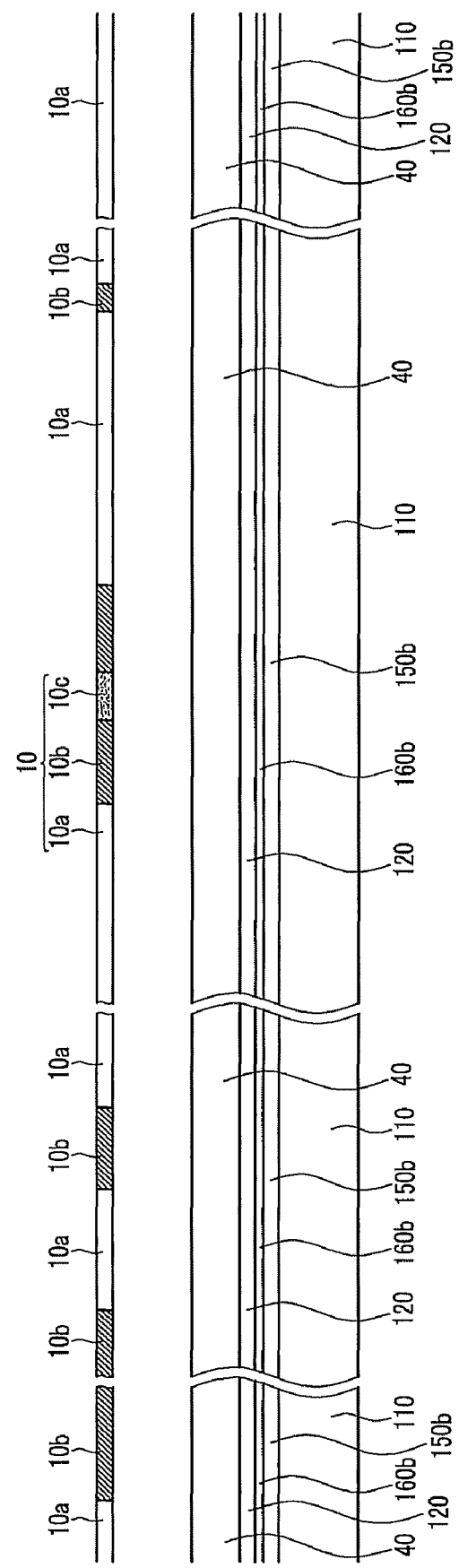

Referring to FIGS. 4 and 5, an amorphous silicon layer 150a and an impurity doped amorphous silicon layer 160a are sequentially deposited on an insulating substrate 110.

Next, the amorphous silicon layer 150a and the impurity doped amorphous silicon layer 160a are crystallized to form a polycrystalline silicon layer 150b and an impurity doped polycrystalline silicon layer 160b. In one exemplary embodiment, the crystallization may be performed by a solid phase crystallization ("SPC") process. Alternative exemplary embodiments include the use of a rapid thermal annealing ("RTA") process, a liquid phase recrystallization ("LPR") process, or an excimer laser annealing ("ELA") process to perform the crystallization.

Sequentially, a conductive layer 120 is deposited on the impurity doped polycrystalline silicon layer 160b, and a photoresist 40 is coated on the conductive layer 120. In one exemplary embodiment, the conductive layer 120 may be made of a material such as Al.

Thereafter, a photomask 10 is disposed on or above the photoresist 40. The photomask 10 includes light transmitting areas 10a, light blocking areas 10b, and translucent areas 10c. In one exemplary embodiment, the translucent areas 10c may have a slit pattern, a lattice pattern, or a thin film(s) with intermediate transmittance or intermediate thickness. In the exemplary embodiment, using a slit pattern, the width of the slits or the distance between the slits may be smaller than the resolution of a light exposure used for the photolithography.

Figure 6:
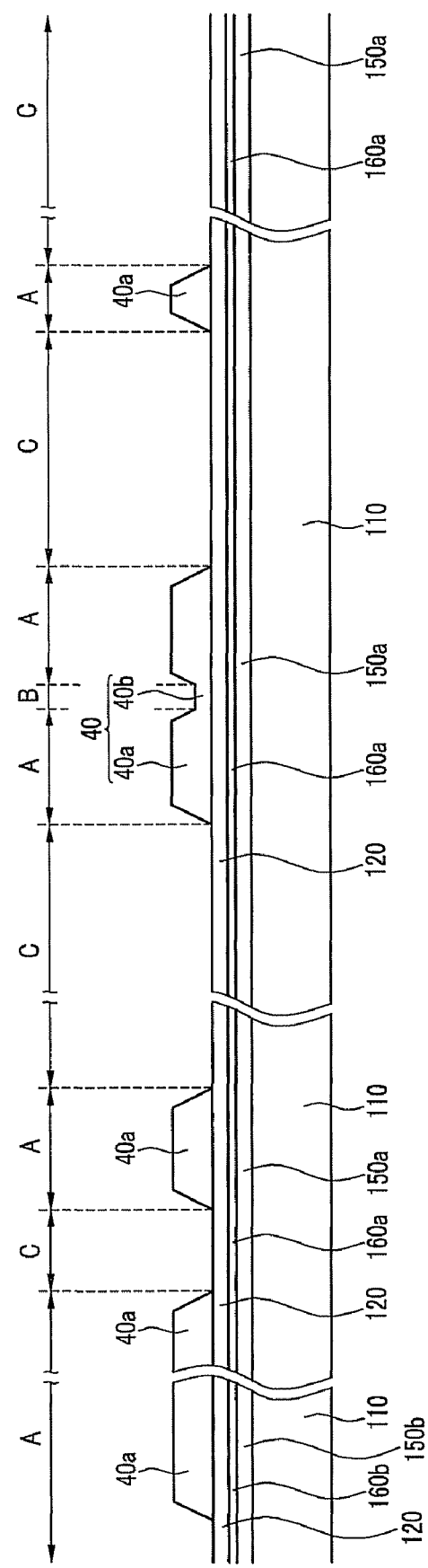

The photoresist 40 is exposed to light through the photomask 10 and it is developed such that portions of the photoresist 40 which receive a predetermined amount of light are removed. Referring to FIG. 6, portions of the photoresist 40 facing the light transmitting areas 10a of the photomask 10 are removed, first portions 40a of the photoresist 40 facing the light blocking areas 10b are substantially unmodified by the developing process, and second portions 40b of the photoresist 40 facing the translucent areas 10c are reduced in thickness.

The thickness ratio of the second portions 40b to the first portions 40a of the photoresist 40 is adjusted depending upon the process conditions in the subsequent process steps. In one exemplary embodiment the thickness of the second portions 40b of the photoresist 40 is equal to or less than about half of the thickness of the first portions 40a of the photoresist 40.

The light blocking areas 10b correspond to portions A (referred to as "electrode portions") where gate lines 121, driving input electrodes 173b, and driving output electrodes 175 are formed; the translucent areas 10c correspond to portions B (referred to as "channel portions") where channels on the driving semiconductor islands 154b are formed; and the light transmitting areas 10a correspond to the remaining portions C.

Figure 7:
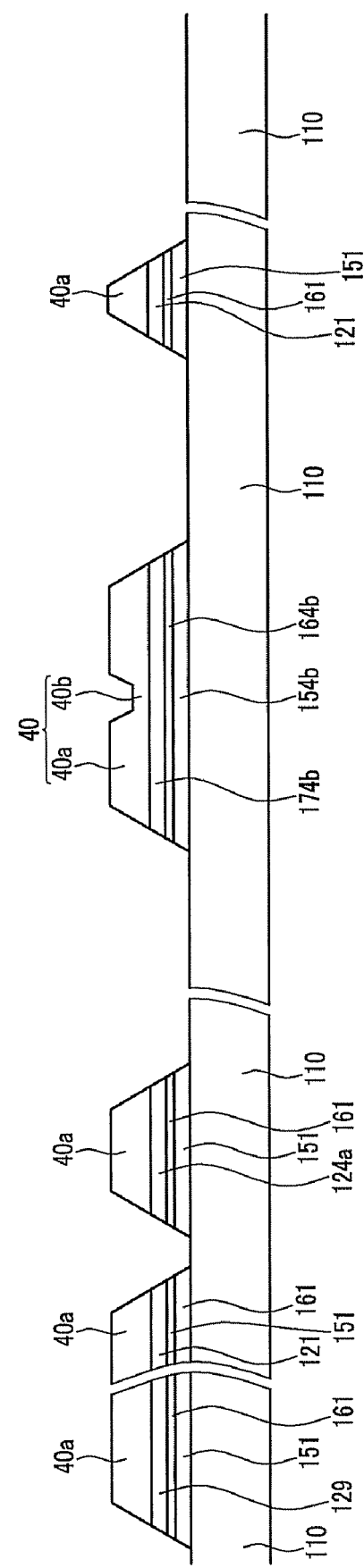

Next, referring to FIG. 7, the exposed conductive layer 120 which corresponds to the remaining portions C is wet-etched using the first and second portions 40a and 40b of the photoresist 40 as an etch mask to form gate lines 121 including switching control electrodes 124a and end portions 129, and conductive members 174b.

Thereafter, the exposed polycrystalline silicon layer 150b and the impurity doped polycrystalline silicon layer 160b are sequentially dry-etched again using the first and second portions 40a and 40b of the photoresist 40 as an etch mask to form semiconductor stripe members 151, the driving semiconductor islands 154b, impurity doped semiconductor stripe members 161, and ohmic contact layers 164b. The semiconductor stripe members 151 and the impurity doped semiconductor stripe members 161 have substantially the same planar shape as the gate lines 121, and the driving semiconductor islands 154b and the ohmic contact layers 164b have substantially the same planar shape as the conductive members 174b.

Figure 8:
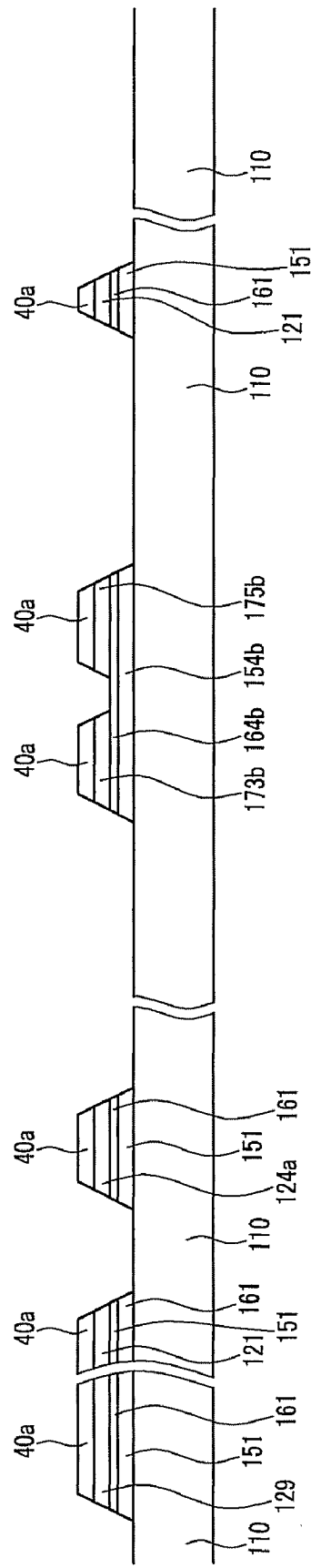

Next, as shown in FIG. 8, the second portions 40b of the photoresist 40 are removed. In one exemplary embodiment the removal is performed by ashing. The thickness of the first portions 40a of the photoresist 40 may be reduced by an amount substantially equal to the thickness of the removed second portions 40b.

Thereafter, the exposed conductive members 174b are patterned using the first portions 40a of the photoresist 40 as a mask to divide the conductive members 174b into driving input electrodes 173b and driving output electrodes 175b, and the ohmic contact layers 164b in channel portions between the driving input electrodes 173b and the driving output electrodes 175b.

Next, referring to FIGS. 9 and 10, the first portions 40a of the photoresist 40 are removed, and the ohmic contact layers 164b are dry-etched using the driving input electrodes 173b and the driving output electrodes 175b as an etch mask to form a plurality of pairs of ohmic contact islands 163b and 165b.

Referring to FIGS. 11 and 12, a gate insulating layer 140, an intrinsic a-Si layer (not shown), and an impurity doped amorphous silicon layer (not shown) are sequentially deposited on the gate lines 121, the driving input electrodes 173b, and the driving output electrodes 175b, and then the impurity doped amorphous silicon layer and the intrinsic a-Si layer are photo-etched to form switching semiconductor islands 154a and ohmic contact layers 164a.

Next, referring to FIGS. 13 and 14, a conductive layer is deposited on the gate insulating layer 140 and the ohmic contact layers 164a, and then is photo-etched to form data lines 171 including switching input electrodes 173a and end portions 179, driving voltage lines 172, and electrode members 176. A portion of each electrode member 176 functions as a switching output electrode 175a, and another portion of each electrode member 176 functions as a driving control electrode 124b.

The ohmic contact layers 164a are etched using the switching input electrodes 173a and the switching output electrodes 175a as masks to form a plurality of pairs of ohmic contacts 163a and 165a.

Next, referring to FIGS. 15 and 16, a passivation layer 180 is formed on the data lines 171, the switching output electrodes 175a, the driving voltage lines 172, the driving control electrodes 124b, and the exposed gate insulating layer 140. Thereafter, the passivation layer 180 and the gate insulating layer 140 are etched to form a plurality of contact holes 181, 182, 184, 185a and 185b.

Referring to FIGS. 17 and 18, a transparent conductive layer, exemplary embodiments of which may be made of a material such as ITO or IZO is deposited on the passivation layer, and then is etched to form a plurality of pixel electrodes 191, a plurality of connecting members 85, and a plurality of contact assistants 81 and 82.

Next, a photosensitive organic layer is deposited on the pixel electrodes 191, the connecting members 85, the contact assistants 81 and 82, and the passivation layer 180. Then the photosensitive organic layer is exposed to light and developed to form a partition 361 including a plurality of openings 365 (referred to in FIGS. 2 and 3).

Thereafter, a plurality of organic light emitting members 370 each of which includes a hole transport layer (not shown) and an emitting layer (not shown) are formed on the pixel electrodes 191 and confined in the openings 365. The organic light emitting members 370 may be formed by a solution process, exemplary embodiments of which include inkjet printing, or a deposition process. In one exemplary embodiment the formation of the organic light emitting members 370 may be formed by inkjet printing which sprays solution into the openings 365 while moving an inkjet head (not shown). In the exemplary embodiment employing inkjet printing, a drying step for removing solvent follows the inkjet printing.

Next, referring to FIGS. 2 and 3, a common electrode 270 is formed on the partitions 361 and the organic light emitting members 370.

According to the exemplary embodiment of the present invention, even though the structures of the switching TFTs and the driving TFTs are different, the switching control electrodes, the driving input electrodes, and the driving output electrodes are formed using a single mask, and the switching input electrodes, the switching output electrodes and the driving control electrodes are formed using a single mask. Thereby, the number of the masks used in manufacturing the OLED is reduced.

Furthermore, the data voltage drop in the switching TFTs is prevented, the reduction of the current amount transmitted to the light emitting devices and the reduction of the lifetime are reduced or effectively prevented, and the deterioration of the display characteristics of the OLED is prevented.

While the present invention has been described with reference to exemplary embodiments including an organic light emitting diode, it is to be understood that the present invention is not limited thereto, but may include any type of display wherein different characteristics are desired in switching and driving transistors.

While this invention has been described in connection with what is presently considered to be practical exemplary embodiments, it is to be understood that the present invention is not limited to the disclosed exemplary embodiments, but, on the contrary, is intended to cover various modifications and equivalent arrangements included within the spirit and scope of the appended claims.

What is claimed is:

1. An organic light emitting diode display comprising:
   a substrate;
   a gate line disposed on the substrate;
   a data line disposed on the substrate substantially perpendicular to the gate line;
   a driving voltage line disposed substantially parallel to one of the gate line and the data line;
   a switching thin film transistor connected to the gate line and the data line;
   a driving thin film transistor connected to the switching thin film transistor and the driving voltage line; and
   a light emitting diode connected to the driving thin film transistor;
   wherein the driving thin film transistor comprises:
   a first semiconductor including a crystalline semiconductor;
   a driving input electrode disposed on the first semiconductor and connected to the driving voltage line;
   a driving output electrode disposed on the first semiconductor and connected to the light emitting diode; and
   a driving control electrode disposed on the driving input electrode and the driving output electrode and connected to the switching output electrode,
   wherein the switching thin film transistor comprises an amorphous silicon semiconductor and a second semiconductor disposed below the amorphous silicon semiconductor.

2. The organic light emitting diode display of claim 1, wherein the second semiconductor has substantially a same planar shape as the gate line in plan view.

3. The organic light emitting diode display of claim 2, wherein the first semiconductor is disposed on the same layer as the second semiconductor.

4. The organic light emitting diode display of claim 1, wherein the switching thin film transistor and the driving thin film transistor further comprise a gate insulating layer, and
   the gate insulating layer is disposed between the switching control electrode and the amorphous semiconductor and between the first semiconductor and the driving control electrode.

5. The organic light emitting diode display of claim 1, wherein the gate line, the switching control electrode, the driving input electrode, and the driving output electrode are disposed on a same layer.

6. The organic light emitting diode display of claim 5, wherein the data line, the driving voltage line, the switching input electrode, the switching output electrode, and the driving control electrode are disposed on substantially the same layer.

7. The organic light emitting diode display of claim 1, wherein the data line, the driving voltage line, the switching input electrode, the switching output electrode, and the driving control electrode are disposed on substantially a same layer.

8. The organic light emitting diode display of claim 1, wherein the light emitting diode comprises: a pixel electrode connected to the driving thin film transistor; a light emitting member disposed on the pixel electrode; and a common electrode disposed substantially opposite the pixel electrode with respect to the light emitting member.

9. The organic light emitting diode display of claim 8, further comprising a color filter disposed between the substrate and the pixel electrode.

10. The organic light emitting diode display of claim 9, wherein the light emitting member comprises a plurality of emission layers which emit different wavelengths of light, and the different wavelengths of light are synthesized into white light.

11. The organic light emitting diode display of claim 8, further comprising a color filter disposed on the light emitting member.

* * * * *